United States Patent
Hoshi et al.

[11] Patent Number: 6,156,119
[45] Date of Patent: Dec. 5, 2000

[54] SILICON SINGLE CRYSTAL AND METHOD FOR PRODUCING THE SAME

[75] Inventors: Ryoji Hoshi; Kouichi Inokoshi; Tomohiko Ohta, all of Fukushima-ken, Japan

[73] Assignee: Shin-etsu Handotai Co., Ltd., Tokyo, Japan

[21] Appl. No.: 09/270,453

[22] Filed: Mar. 17, 1999

[30] Foreign Application Priority Data

Mar. 20, 1998 [JP] Japan .................................. 10-092465

[51] Int. Cl.$^7$ .................................................. C30B 15/22
[52] U.S. Cl. ................................ 117/30; 117/32; 117/917
[58] Field of Search ............................... 117/13, 30, 32, 117/917; 423/328.1

[56] References Cited

U.S. PATENT DOCUMENTS 4,330,362  5/1982  Zulehner .
5,851,283  12/1998  Hoshi et al. ........................... 117/32

FOREIGN PATENT DOCUMENTS 54-150378  11/1979  Japan .
61-68389   4/1986   Japan .

OTHER PUBLICATIONS

Nikkei Microdevices, Jul. 1986, by Nobuyuki Izawa, et al., pp. 87–108.
Semiconductor Silicon Crystal Technology, 1989, by Fumio Shimura, pp. 171–183.
8 Crystals, Growth, Properties, and Applications, by W. Zulehner and D. Huber, 1982, pp. 3–57.

*Primary Examiner*—Felisa Hiteshew
*Attorney, Agent, or Firm*—Hogan & Hartson, LLP

[57] ABSTRACT

In a method for producing a silicon single crystal of high quality, the silicon single crystal is grown based on a magnetic field applied Czochralski method. The single crystal is grown at a high growth rate satisfying the equation $Vave \geq 120/r$, where Vave denotes an average crystal growth rate, and r denotes a radius of the single crystal, and a rotation number R of the single crystal in growing satisfies the equation $R \leq 1250/r$. Oxygen concentration in-plane distribution is 10% or less, and a deformation ratio of a constant diameter portion in the silicon single crystal in a direction perpendicular to a crystal growth axis direction is 5% or less. The silicon single crystal has a high uniformity of oxygen concentration in-plane distribution without deformation of crystal, even if the crystal is grown at a growth rate exceeding the upper limits found in conventional techniques.

12 Claims, 4 Drawing Sheets

SILICON SINGLE CRYSTAL AND METHOD FOR PRODUCING THE SAME

BACKGROUND OF THE INVENTION

1. Field of the Invention

The present invention relates to a method for producing a silicon single crystal having a high uniformity of oxygen concentration in-plane distribution of single crystal at a high growth rate, and a silicon single crystal.

2. Description of the Related Art

Most of currently produced electronic devices such as processing devices and memories are manufactured on a wafer produced from a silicon single crystal pulled by the Czochralski method (CZ method). The CZ method is a method for growing a silicon single crystal by pulling it from a silicon melt fused in a crucible placed in a heater.

The crystal growth rate in the Czochralski method is determined by heat balance of growing crystal (see FIG. 1). The heat entering into the crystal consists of heat, Hin, transferred from the silicon melt to the crystal and solidification latent heat, Hsol, generated upon phase change of the melt from liquid to solid. As for the heat balance in the vicinity of crystal growing portion, the heat, Hout, emitted from the crystal is considered to be equal to the sum of Hin+Hsol. Because Hout increases in proportion to the crystal surface area, it depends on the crystal radius r [mm], and is proportional to $\pi \cdot r$. Because the magnitude of Hin depends on the cross sectional area of the crystal, it is proportional to $\pi \cdot r^2$. Further, because the magnitude of the solidification latent heat Hsol depends on the volume of crystal growing per unit time, it is a function of $\pi \cdot r^2 \cdot V$ where V denotes crystal growth rate [mm/min]. Accordingly the above-mentioned equation is represented as the following equation: $\alpha \cdot \pi \cdot r = \beta \cdot \pi \cdot r^2 + \gamma \cdot \pi \cdot r^2 \cdot V$. This equation is transformed into an equation:

$$V = a/r + b \qquad (1).$$

In the equation (1), it has empirically been found that an average growth rate Vave applicable to industrial production of crystals can be obtained with a of 115 or less and b of 0. That is, it should be around 2.26 mm/min or less for a crystal having a diameter of 4 inches, 1.51 mm/min or less for a crystal having a diameter of 6 inches, 1.13 mm/min or less for a crystal having a diameter of 8 inches, and 0.75 mm/min or less for a crystal having a diameter of 12 inches.

As examples of prior art utilizing a relatively high pulling rate, Japanese Patent Application Nos. Sho 54-41161/1979 and Sho 59-187082/1984 can be mentioned. The pulling rate was 2–3 mm/min for a diameter of 80 mm [2.88 mm/min in the formula (1)] in the former application, and 2.3 mm/min for a diameter of 4 inches in the latter application. These techniques mainly rely on use of larger Hout mentioned above, which is obtained by increasing the temperature gradient along the axis direction (dT/dz)c in the vicinity of growing interface of the crystals. Theoretically, if this temperature gradient could limitlessly be made larger, the maximal value Vmax of the average growth rate could also be limitlessly made larger. However, actual use of steep temperature gradient may cause solidification of silicon melt, which impedes the use of higher growth rate. Therefore, such average growth rates as mentioned above are considered as the limit. That is, the actual limit of the average growth rate would be around 2.26 mm/min or less for a crystal having a diameter of 4 inches, 1.51 mm/min or less for a crystal having a diameter of 6 inches, 1.13 mm/min or less for a crystal having a diameter of 8 inches, and 0.75 mm/min or less for a crystal having a diameter of 12 inches.

Of course, if productivity and production yield are ignored, or quality is ignored on an experimental basis, it is possible to temporarily exceed the values mentioned above. For example, if an extremely short crystal is grown, the average crystal growth rate may exceed the rates mentioned above. Further, it is also possible to exceed the rates mentioned above by ignoring ununiformity of in-plane (radial) distribution of oxygen concentration, and using a lower rotation rate.

However, if a higher crystal growth rate is used in such methods, use of such constrained operation conditions may prevent single crystals from growing, and cause problems concerning quality, that may lead to undue reduction of productivity and production yield, generation of projections on crystal surfaces, failing in obtaining a cylindrical single crystal ingot to be processed into a wafer required to have a given diameter due to deformation of the crystals themselves, or the like. Such deformation may be suppressed to some extent by using a low angular rate around the crystal with a low rotation rate of the crystal. However, in such a case, in-plane distribution of oxygen concentration may disadvantageously be degraded to an undue extent to reach such a level that cannot be used for an industrial product. Eventually, it has not been able to produce silicon single crystals which could be used as industrial products at a growth rate higher than those rates mentioned above.

SUMMARY OF THE INVENTION

The present invention has been completed to solve these problems, and its object is mainly to provide a method that can produce a silicon single crystal having a high uniformity of oxygen concentration in-plane (radial) distribution without suffering deformation of crystal, even if the single crystal is grown at a growth rate exceeding the upper limits found in the prior art, and to provide a silicon single crystal of high quality, thereby markedly improving productivity and production yield.

The present invention, which has been accomplished to achieve the aforementioned object, provides a method for producing a silicon single crystal by growing the silicon single crystal based on a magnetic field applied Czochralski method (also referred to as "MCZ method" hereinafter), wherein the single crystal is grown at a high growth rate satisfying the equation: Vave≧120/r where Vave denotes an average crystal growth rate [mm/min], and r denotes a radius of the single crystal [mm].

According to the aforementioned method, even if a silicon crystal is grown by the MCZ method at an average crystal growth rate Vave exceeding the upper limits found in the prior art, so long as it satisfies the aforementioned equation [for example, 1.18 mm/min or more for a diameter of 8 inches (crystal having a diameter of 203 mm)], the temperature gradient in the silicon melt in the radial direction can be made larger, solidification from the wall of the crucible and crystal deformation can be prevented, and a silicon single crystal having a high uniformity of oxygen concentration in-plane distribution can be produced while maintaining high productivity and production yield.

In the aforementioned method, a rotation number R [rpm] of the single crystal in growing preferably satisfies the equation: R≦1250/r.

If the rotation number R [rpm] of the single crystal in growing is a value satisfying the foregoing equation [for example, 12.3 rpm or less for a diameter of 8 inches], the crystal can be grown at a further higher rate, because the deformation of crystal accompanying the use of a higher crystal growth rate can be prevented by the use of a lower crystal rotation rate.

In the aforementioned method, the applied magnetic field is preferably a horizontal magnetic field, and the magnetic field is preferably applied so that the center magnetic field intensity of the horizontal magnetic field should be within the range of 500–6000 Gauss, and the magnetic field center should be positioned below the melt surface at the rotation axis of the single crystal.

By using a horizontal magnetic field as the applied magnetic field (also referred to as "HMCZ method" hereinafter), and applying the magnetic field so that the center magnetic field intensity of the horizontal magnetic field should be within the range of 500–6000 Gauss, and the magnetic field center should be positioned below the melt surface at the rotation axis of the single crystal in the MCZ method as defined above, convection of the silicon melt along the longitudinal direction is efficiently prevented, and hence ununiformity of the oxygen concentration between the center portions and peripheral portions of the crystal growth interface accompanying the use of a lower crystal rotation rate is improved, thereby use of a higher crystal growth rate can be realized without deformation of crystal.

The present invention further provides a silicon single crystal which is produced by the aforementioned method. In the silicon single crystal, oxygen concentration in-plane distribution is preferably 10% or less. The deformation ratio of the constant diameter portion in the silicon single crystal in the direction perpendicular to the crystal growth axis direction is preferably 5% or less.

The silicon single crystal produced by the HMCZ method of the present invention can be a silicon single crystal of high quality which has little deformation, and substantially round(circular) cross section, thus causing substantially almost no loss when it is ground into a cylindrical shape in the process for processing a single crystal into wafers, and has a high uniformity of oxygen concentration in-plane distribution and reduced size of the so-called grown-in defects over the entire surface of a wafer, in spite of the fact that the crystal has been grown at a high growth rate not found in the prior art.

According to the present invention, use of a higher crystal growth rate can be realized, and it becomes possible to improve productivity and production yield of silicon single crystals, and greatly reduce the production cost of single crystals. Further, uniform in-plane distribution of oxygen concentration can be obtained, and silicon single crystal wafers of high quality over the entire surfaces can be produced.

In addition, the use of higher crystal growth rate accelerates the cooling rate during the crystal growth, and thus it becomes possible to reduce the size of grown-in defects growing during the process. Accordingly, the defects having the reduced size can be eliminated by applying an appropriate heat treatment to wafers, and thus wafers having a low defect density can readily be obtained with low cost. Furthermore, substantially defect-free wafers having little crystal defect can also be obtained by using those silicon single crystals as substrate wafers for epitaxial wafers.

DESCRIPTION OF THE INVENTION AND PREFERRED EMBODIMENTS

Figure 1:
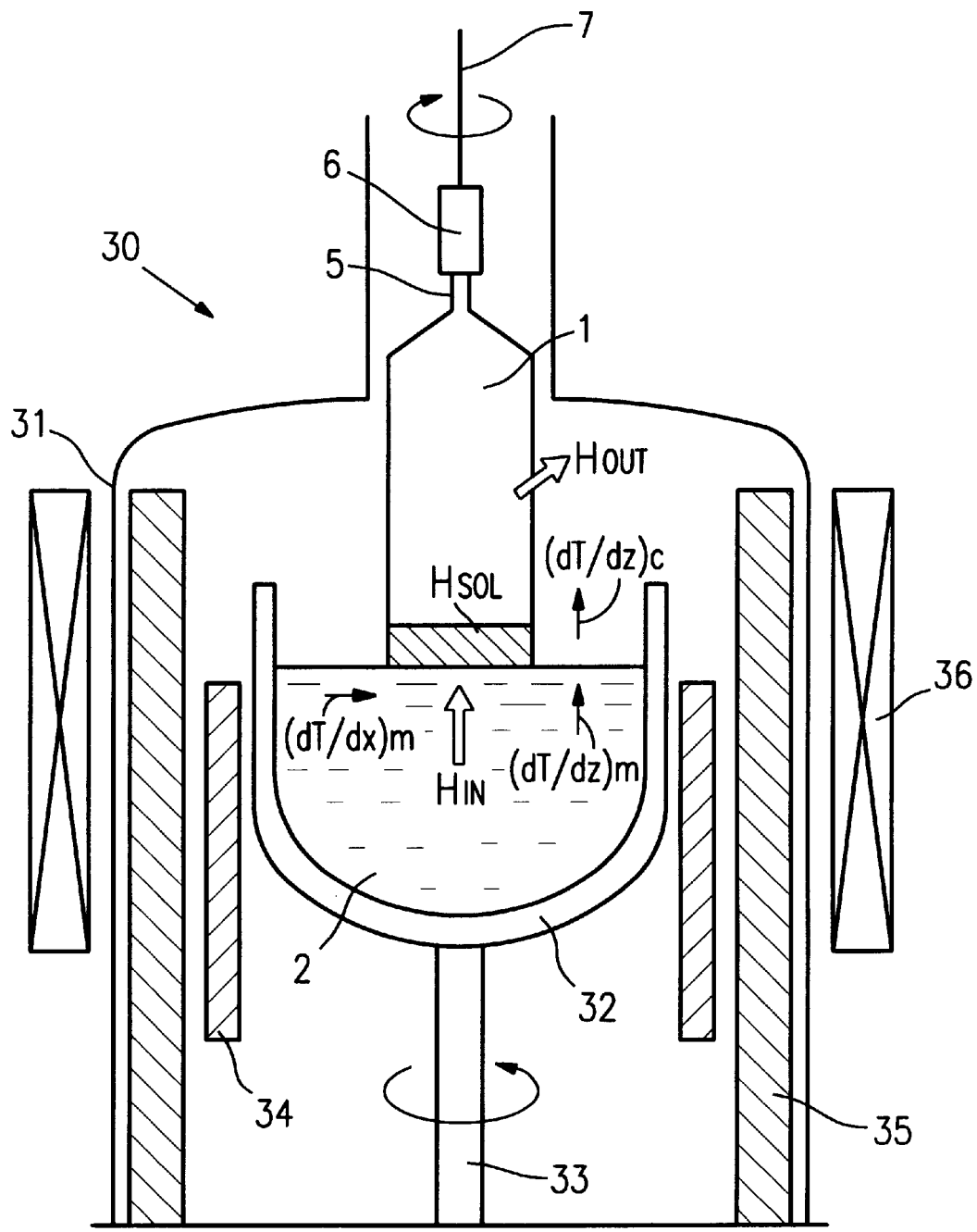
FIG. 1 is a schematic explanatory view of an apparatus for pulling single crystals by an HMCZ method, which was used for the present invention.

The present invention will be detailed hereinafter, but the scope of the present invention is not limited to them.

The inventors of the present invention found that a crystal maintaining uniformity of in-plane distribution of impurities required as an industrial product can be produced at a crystal growth rate exceeding those found in conventional techniques by using the CZ method where a horizontal magnetic field is applied (HMCZ method) and a low crystal rotation rate, established the various requirements therefor through detailed examination and experiments, and thus accomplished the present invention.

As an example of the prior art techniques which realized a high crystal growth rate, there can be mentioned a technique where the temperature gradient in the radial direction $(dT/dx)m$ in the silicon melt can be made larger by preventing thermal convection with a magnetic field applied to the silicon melt, thereby preventing the solidification from the crucible wall, which is likely to occur when a high growth rate is used (see Nikkei Microdevice, July, 1986). Further, by applying a horizontal magnetic field, the temperature gradient of the silicon melt below the crystal along the axial direction $(dT/dz)m$ can be made smaller, and thus Hin can be made smaller (see Fumio Shimura, Semiconductor Silicon Crystal Technology, 1989). By using these techniques, the upper limit of the maximum crystal growth rate Vmax can be made higher. However, analysis of these factors only afforded a crystal growth rate within the aforementioned range.

When it is attempted to use a further higher growth rate, the deformation of the crystal itself becomes to be likely to occur. To suppress the deformation, it is effective to use a lower crystal rotation rate. However, when the crystal rotation rate is lowered, the oxygen concentration distribution in the crystal growth interface becomes ununiform because the oxygen concentration in the silicon melt around the growing crystal is reduced due to evaporation of oxygen. In the conventional CZ methods, this ununiformity of oxygen concentration between the center portions and the peripheral portions is forcibly eliminated by forced convection caused by crystal rotation (see W. Zulehner et al. Crystal, vol. 8, 1982 and the like).

However, it has been known that, when a magnetic field is applied, convection in the direction traversing the magnetic flux is suppressed. In the HMCZ method, because the convection in the longitudinal direction is suppressed by the magnetic flux in the traverse direction, the oxygen evaporation in the peripheral portions of the crystal may be more suppressed compared with a usual CZ method. Therefore, the thickness of the boundary diffusion layer of the crystal growth surface does not become thinner compared with that of the peripheral portions as observed in the usual CZ method. Accordingly, the in-plane distribution of oxygen concentration is not unduly degraded even if the crystal rotation rate is lowered, and it is possible to use a lower crystal rotation rate. Thus, growth at a high rate can be realized without causing deformation of the crystal.

As for the specific requirements of the crystal growth at a high rate according to the present invention, it was initially found that a silicon single crystal can be grown at a high rate satisfying the equation: $V_{ave} \geq 120/r$ where $V_{ave}$ denotes an average crystal growth rate [mm/min] by growing the single crystal based on the Czochralski where a magnetic field is applied and r denotes a radius of the single crystal [mm].

The coefficient 120 in the above equation corresponds to the coefficient a in the equation (1): $V=a/r+b$. The empirical rules found in the CZ method may also be applied to the MCZ method, and this has been supported by detailed investigations and experiments. As described above, even if the growing is performed at an average crystal growth rate $V_{ave}$ exceeding the upper limits found in the prior art, a silicon single crystal having a high uniformity of oxygen concentration in-plane distribution can be produced while maintaining high productivity and production yield, so long as $V_{ave}$ satisfies the aforementioned equation [for example, 1.18 mm/min or more for a diameter of 8 inches]. Further, cooling rate during crystal growth is also accelerated as the crystal growth rate becomes higher, and it enables reduction of size of the grown-in defects, which grow during the process.

Another preferred condition is that the rotation number R [rpm] of the single crystal in growing should satisfy the equation: $R \leq 1250/r$.

By selecting the rotation number R of the single crystal in growing satisfying the above equation as defined above [for example, 12.3 rpm or less for a diameter of 8 inches], the deformation of crystal accompanying the use of a higher crystal growth rate can be prevented by the use of a lower crystal rotation rate, and thus stable growth and improvement of production yield can be obtained.

In addition, by using a horizontal magnetic field as the applied magnetic field, and applying magnetic field so that the magnetic field center during a crystal growth should be positioned below the melt surface at the rotation axis of the single crystal, and the center magnetic field intensity of the horizontal magnetic field should be within the range of 500–6000 Gauss in the above method, convection of the silicon melt along the longitudinal direction is efficiently prevented, and ununiformity of the oxygen concentration between the center portions and peripheral portions of the crystal growth interface accompanying the use of a lower crystal rotation rate is improved, thereby use of a higher crystal growth rate can be realized without deformation of crystal.

When the intensity is less than 500 Gauss, the prevention of the convection of the silicon melt may be insufficient due to the weak magnetic field intensity. When the intensity is higher than 6000 Gauss, leakage magnetic field in the circumferential area becomes larger, which may cause problems concerning safety and operation control. Therefore, the magnetic field is preferably used in the range of 500–6000 Gauss.

According to the present invention, while a vertical magnetic field, cusped magnetic field or the like may also be used as the applied magnetic field instead of the horizontal magnetic field, the horizontal magnetic field component of these fields is weak, and hence larger effect of preventing the oxygen evaporation in the peripheral portion can be obtained by the horizontal magnetic field.

Embodiments of the present invention will be detailed hereinafter with reference to the appended drawings.

First, an example of an apparatus for pulling single crystals by the HMCZ method used for the present invention will be explained by referring to FIG. 1. As shown in FIG. 1, the apparatus for pulling single crystals 30 is constituted by a pulling chamber 31, crucible 32 provided in the pulling chamber 31, heater 34 disposed around the crucible 32, crucible-holding shaft 33 for rotating the crucible 32 and rotation mechanism therefor (not shown), seed chuck 6 for holding a silicon seed crystal 5, cable 7 for pulling the seed chuck 6, and winding mechanism (not shown) for rotating and winding the cable 7. The crucible 32 is composed of an inner quartz crucible for accommodating a silicon melt (molten metal) 2, and an outer graphite crucible. Further, insulating material 35 surrounds the outside of the heater 34.

A magnet 36 for applying horizontal magnetic field is installed outside the pulling chamber 31 in the horizontal direction so as to prevent the convection of the silicon melt 2, and realizes stable growth of single crystal in the HMCZ method.

Now, the method for growing a single crystal by the aforementioned apparatus for pulling single crystals 30 based on the HMCZ method will be explained hereinafter.

First, a silicon polycrystal material of high purity is melted in the crucible 32 by heating to a temperature higher than the melting point (about 1420° C.). Then, a horizontal magnetic field is applied, and a tip end of the seed crystal 5 is brought into contact with, or immersed into the surface of the melt 2 at its approximate center portion by reeling out the cable 7. Then, the crucible-holding shaft 33 is rotated in an optional direction, and the seed crystal 5 is simultaneously pulled upwardly by winding up the cable 7 with rotating the cable to start the growing of single crystal. Thereafter, a single crystal ingot 1 approximately in a cylindrical shape can be obtained by controlling the pulling rate and temperature.

By growing a silicon single crystal using the above-described production method and apparatus with appropriate conditions of the HMCZ method of the present invention, in spite of the growth at high rate, a single crystal ingot can be obtained which exhibits extremely little deformation, and an approximately round cross-section characterized by a deformation ratio of the constant diameter portion in the silicon single crystal in the direction perpendicular to the crystal growth axis direction of 5% or less, causing substantially almost no loss when it is ground into a cylindrical shape in the process for processing a single crystal into wafers.

The deformation ratio herein used means a value calculated as to the diameter in the constant diameter portion having a constant diameter between the cone portion and the tail portion of the single crystal ingot in the same plane perpendicular to the crystal growth axis direction in accordance with the following equation:

[(Maximum diameter−Minimum diameter)/Maximum diameter]× 100 (%)

It is further possible to obtain a silicon single crystal of high quality which has an oxygen concentration in-plane distribution of 10% or less, and reduced size of grown-in defects over the entire wafer surface.

EXAMPLES

Specific embodiments of the present invention will be explained hereinafter with reference to the following working examples, but the present invention is not limited to them.

(Test 1)

Figure 3:
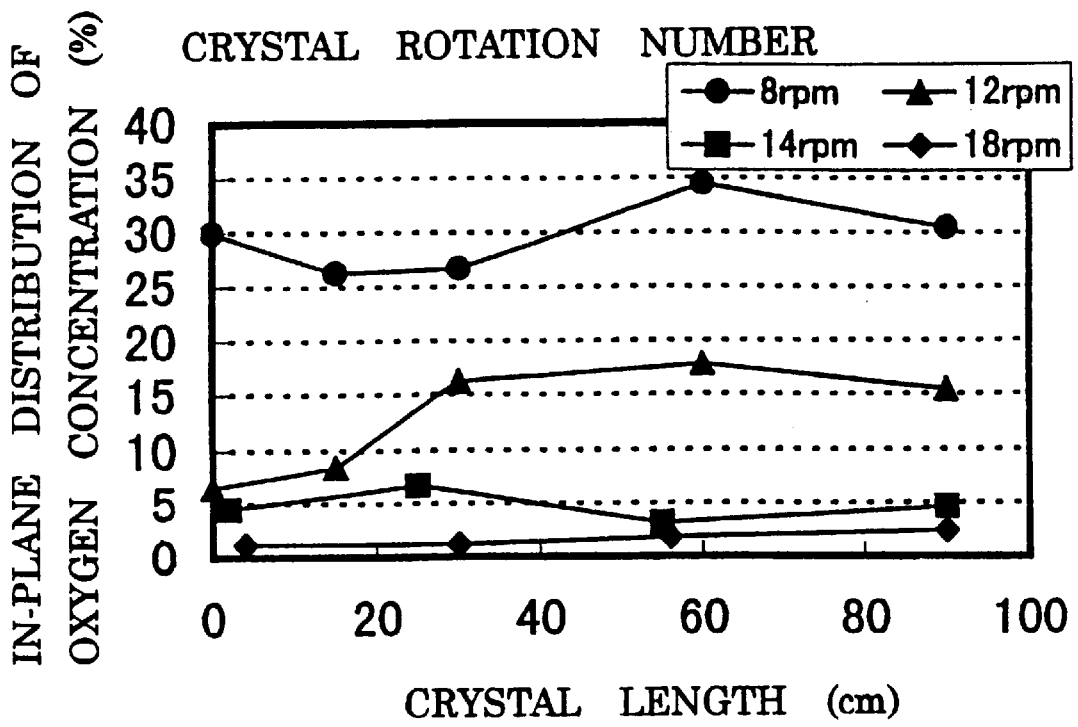
FIG. 3 is a graph representing crystal rotation-dependency of in-plane distribution of oxygen concentration of a silicon single crystal obtained by a conventional CZ method without magnetic field.

According to a usual CZ method not utilizing any magnetic field, an 8-inch silicon single crystal having a straight body length of 90–100 cm was grown from a crucible having a diameter of 24 inches at a straight body average growth rate of 0.8–1.0 mm/min. The crystal rotation number was varied as 18, 14, 12, or 8 rpm. Sample wafers were sliced from these crystals, and oxygen concentration was measured at the center portions and peripheral portions (10 mm from the edge) to determine the oxygen concentration in-plane distribution defined as [|Center concentration−Peripheral concentration|/Center concentration]×100 (%). The results, i.e., the in-plane distributions of oxygen concentration at various crystal lengths are shown in FIG. 3 for each crystal rotation number. As shown in FIG. 3, the in-plane distribution of oxygen concentration was gradually degraded from ~2% to ~5%, ~15%, and ~30% as the crystal rotation rate was lowered.

(Test 2)

Figure 2:
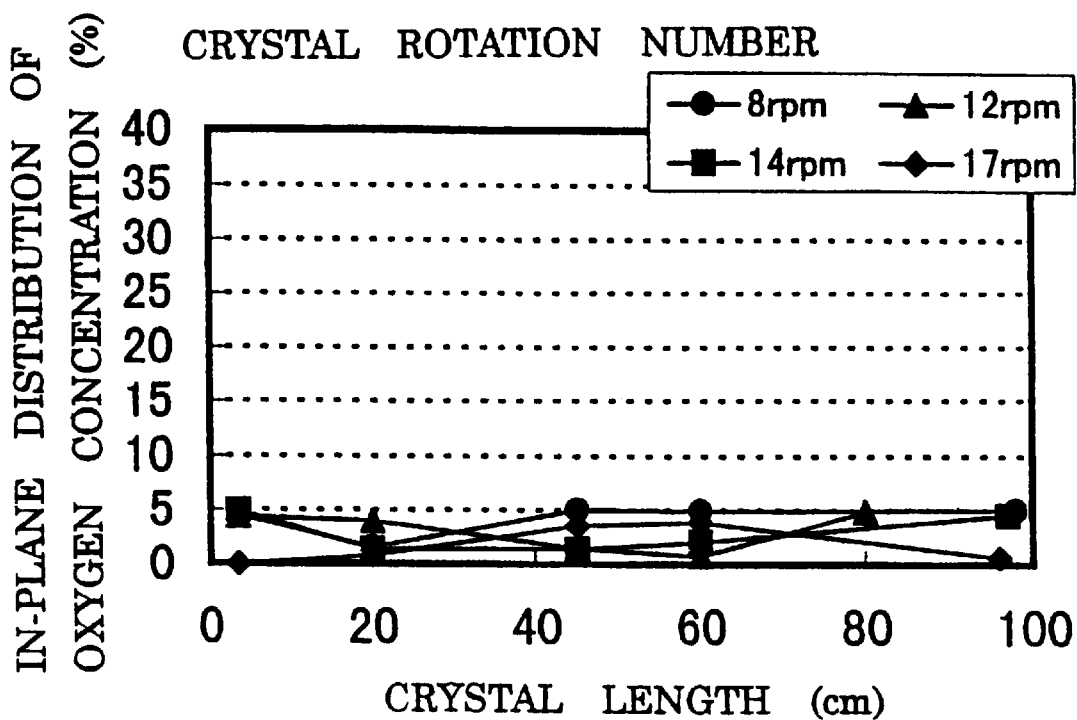
FIG. 2 is a graph representing crystal rotation-dependency of in-plane distribution of oxygen concentration of a silicon single crystal obtained by an HMCZ method.

By using an HMCZ method where the magnetic field center was positioned below the melt surface at the crystal rotation axis, and a horizontal magnetic field having a center magnetic field intensity of 4000 Gauss was applied, an 8-inch silicon single crystal having a straight body length of 100 cm was grown from a crucible having a diameter of 24 inches at a straight body average growth rate of 0.8–1.0 mm/min. The crystal rotation number was varied as 17, 14, 12, or 8 rpm. Further, the crucible was gradually moved upwardly in accordance with the growth of the crystal, so that the magnetic field center should always be positioned below the silicon melt surface. From the results shown in FIG. 2, it can be seen that the in-plane distribution of oxygen concentration obtained by the HMCZ method was 5% or less for any of the crystal rotation numbers.

(Example 1)

Figure 4:
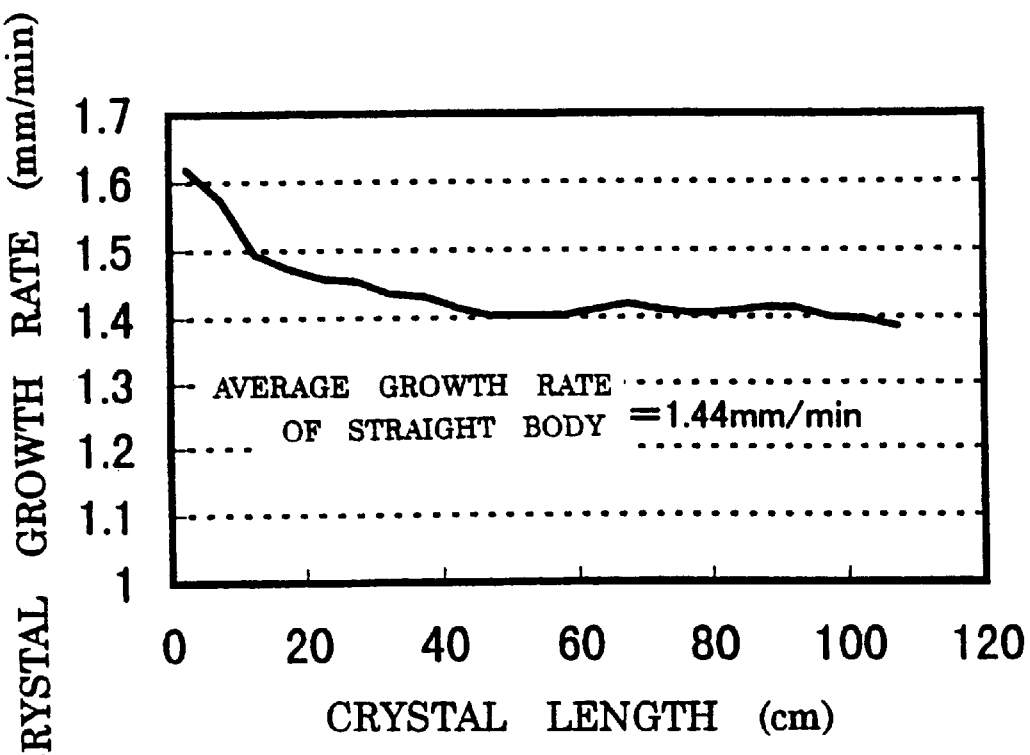
FIG. 4 is a graph representing variation of growth rate during high rate growth by an HMCZ method according to the present invention.

In Test 2 (HMCZ method, center magnetic field intensity: 4000 Gauss, crucible diameter: 24 inches), the crystal rotation number of 8 rpm was selected, and it was attempted to use a higher crystal growth rate. As a result, a crystal having a straight body length of 110 cm could be grown without substantial crystal deformation at a straight body average growth rate of 1.44 mm/min (see FIG. 4). The deformation ratio in the constant diameter portion of this crystal was 5% or less.

Figure 5:
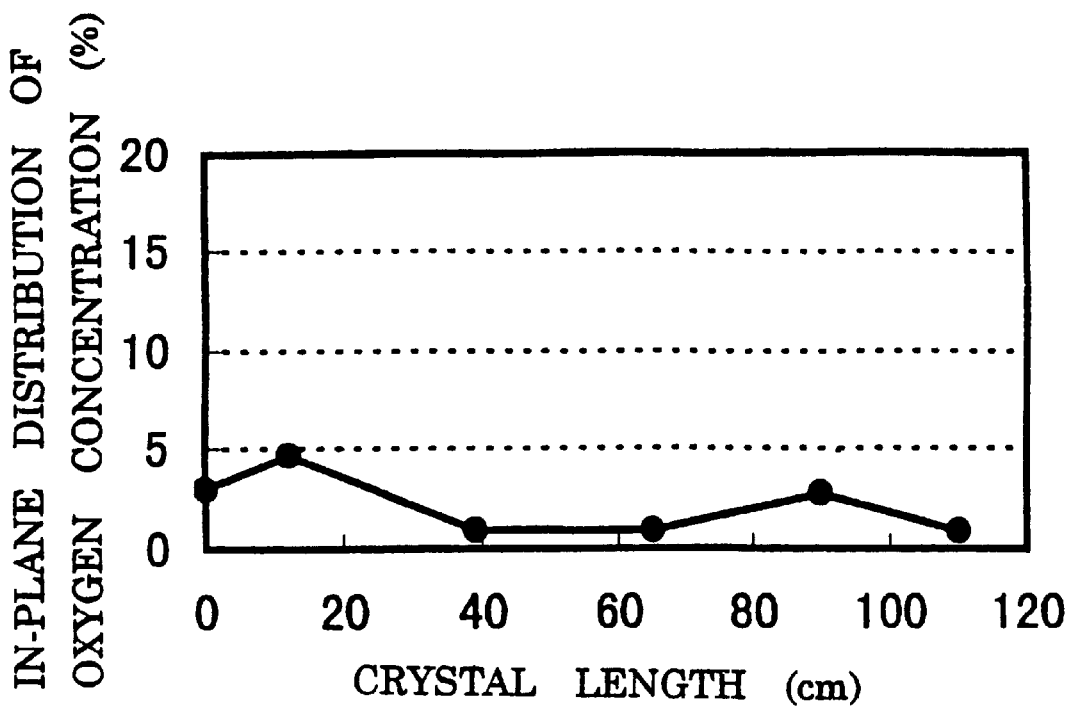
FIG. 5 is a graph representing in-plane distribution of oxygen concentration of a silicon single crystal during high rate growth by an HMCZ method according to the present invention.

This growth rate greatly exceeds the maximum average growth rate Vave=1.13 mm/min of the aforementioned conventional techniques, and satisfies the requirement of the equation: Vave≧120/r=120/101.6=1.18 mm/min. As shown in FIG. 5, the in-plane distribution of oxygen concentration was 5% or less at any position of the crystal.

(Example 2)

Figure 6:
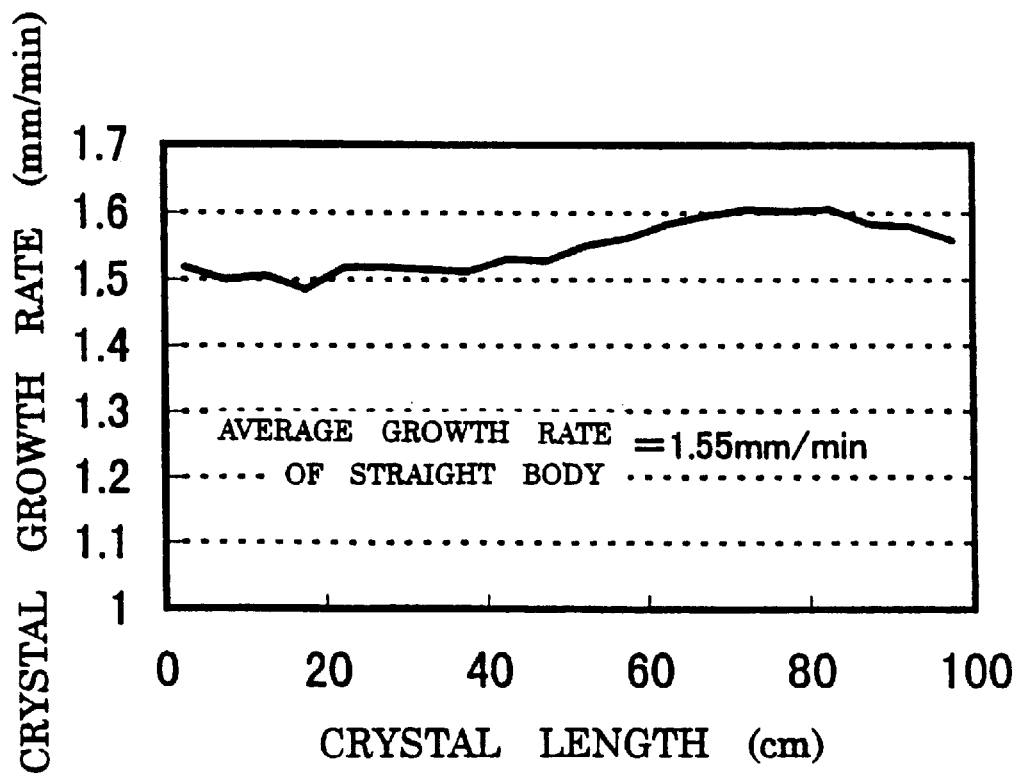
FIG. 6 is a graph representing variation of growth rate during high rate growth at another rate by an HMCZ method according to the present invention.

In Test 2 (HMCZ method, center magnetic field intensity: 4000 Gauss, crucible diameter: 24 inches), the crystal rotation number of 6 rpm was selected, and it was attempted to use a higher crystal growth rate. As a result, a crystal having a straight body length of 100 cm could be grown without substantial crystal deformation at a straight body average growth rate of 1.55 mm/min (see FIG. 6). The deformation ratio in the constant diameter portion of this crystal was 5% or less.

Figure 7:
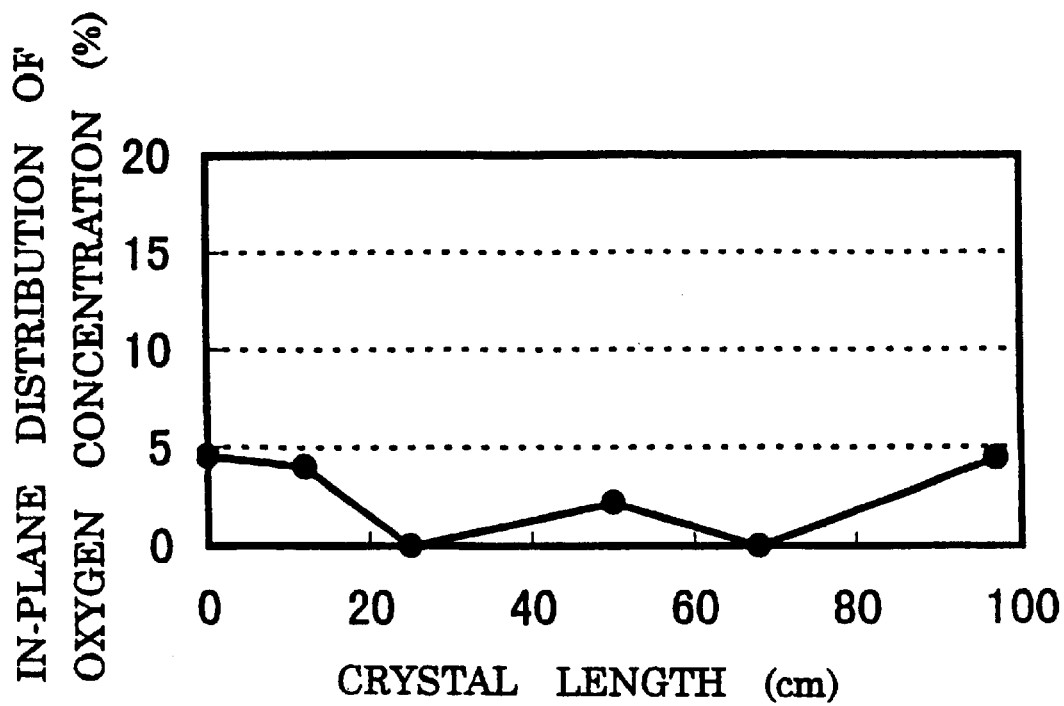
FIG. 7 is a graph representing in-plane distribution of oxygen concentration of a silicon single crystal during high rate growth at another rate by an HMCZ method according to the present invention.

This growth rate greatly exceeds the maximum average growth rate Vave=1.13 mm/min of the aforementioned conventional techniques, and satisfies the requirement of the equation: Vave≧120/r=120/101.6=1.18 mm/min. As shown in FIG. 7, the in-plane distribution of oxygen concentration was 5% or less at any position of the crystal.

(Example 3)

By using an HMCZ method where the magnetic field center was positioned below the melt surface at the crystal rotation axis, and a horizontal magnetic field having a center magnetic field intensity of 4000 Gauss was applied, a 12-inch silicon single crystal having a straight body length of 50 cm was grown from a crucible having a diameter of 28 inches. When a crystal rotation number of 8 rpm was selected in this method, the crystal can be grown at a straight body average growth rate of 0.95 mm/min (the maximum average growth rate of the aforementioned conventional technique, Vave=0.75 mm/min). In this method, the crucible was gradually moved upwardly in accordance with the growth of the crystal, so that the magnetic field center should always be positioned below the silicon melt surface. The in-plane distribution of oxygen concentration was 5% or less over the entire crystal length.

The present invention is not limited to the embodiments described above. The above-described embodiments are mere examples, and those having the substantially same structure as that described in the appended claims and providing the similar functions and advantages are included in the scope of the present invention.

For example, while the above-mentioned embodiments concern growing of silicon single crystals having a diameter of 8 inches or 12 inches, the present invention is not limited to them, and applicable to, for example, silicon single crystals having a diameter of 16 inches or more.

What is claimed is:

1. A method for producing a silicon single crystal by growing the silicon single crystal based on a magnetic field applied Czochralski method, wherein the single crystal is grown at a high growth rate satisfying the equation: Vave≧120/r where Vave denotes an average crystal growth rate [mm/min], and r denotes a radius of the single crystal [mm].

2. The method according to claim 1, wherein a rotation number R [rpm] of the single crystal in growing satisfies the equation: R≦1250/r.

3. The method according to claim 2, wherein the applied magnetic field is a horizontal magnetic field.

4. The method according to claim 3, wherein the magnetic field is applied so that center magnetic field intensity of the horizontal magnetic field should be within the range of 500–6000 Gauss, and magnetic field center should be positioned below melt surface at rotation axis of the single crystal.

5. The method according to claim 2, wherein the magnetic field is applied so that center magnetic field intensity of the horizontal magnetic field should be within the range of 500–6000 Gauss, and magnetic field center should be positioned below melt surface at rotation axis of the single crystal.

6. The method according to claim 1, wherein the applied magnetic field is a horizontal magnetic field.

7. The method according to claim 6, wherein the magnetic field is applied so that center magnetic field intensity of the horizontal magnetic field should be within the range of 500–6000 Gauss, and magnetic field center should be positioned below melt surface at rotation axis of the single crystal.

8. The method according to claim 1, wherein the magnetic field is applied so that center magnetic field intensity of the horizontal magnetic field should be within the range of 500–6000 Gauss, and magnetic field center should be positioned below melt surface at rotation axis of the single crystal.

9. A silicon single crystal which is produced by the method according to claim 1.

10. The silicon single crystal of claim 9, wherein oxygen concentration in-plane distribution of the silicon single crystal is 10% or less.

11. The silicon single crystal of claim 10, wherein deformation ratio of constant diameter portion in the silicon single crystal in a direction perpendicular to crystal growth axis direction is 5% or less.

12. The silicon single crystal of claim 9, wherein deformation ratio of constant diameter portion in the silicon single crystal in a direction perpendicular to crystal growth axis direction is 5% or less.

* * * * *